(12) United States Patent
Frulio et al.

(10) Patent No.: US 6,771,200 B2
(45) Date of Patent: Aug. 3, 2004

(54) DAC-BASED VOLTAGE REGULATOR FOR FLASH MEMORY ARRAY

(75) Inventors: Massimiliano Frulio, Milan (IT); Stefano Sivero, Vergiate (IT); Simone Bartozi, Cambiago (IT); Sabina Mognoni, Monza (IT)

(73) Assignee: Atmel Corporation, San Jose, CA (US)

( * ) Notice: Subject to any disclaimer, the term of this patent is extended or adjusted under 35 U.S.C. 154(b) by 21 days.

(21) Appl. No.: 10/407,647

(22) Filed: Apr. 3, 2003

(65) Prior Publication Data

US 2004/0046681 A1 Mar. 11, 2004

(51) Int. Cl.[7] .............................................. H03M 1/66
(52) U.S. Cl. ........................ 341/144; 341/145; 341/120
(58) Field of Search ................................ 341/144, 145, 341/120, 118, 136

(56) References Cited

U.S. PATENT DOCUMENTS

| | | | |
|---|---|---|---|
| 5,453,953 A | * | 9/1995 | Dhong et al. .......... 365/189.09 |
| 5,563,499 A | * | 10/1996 | Pinney ........................ 323/266 |
| 6,441,593 B1 | * | 8/2002 | Saripella ..................... 323/268 |
| 2002/0145892 A1 | * | 10/2002 | Shor et al. ..................... 363/59 |

* cited by examiner

*Primary Examiner*—Brian Young
*Assistant Examiner*—John Nguyen
(74) *Attorney, Agent, or Firm*—Sierra Patent Group, Ltd.

(57) ABSTRACT

A DAC-based voltage regulator system for a non-volatile memory device comprises a charge pump circuit having an enable input and a voltage output node. A voltage-to-current converter has an input coupled to the voltage output node and an output coupled to a virtual ground node. A current source is coupled to the virtual ground node and sinks one of a plurality of currents in response to states of a plurality of digital input signals. A transconductance amplifier has an inverting input at the virtual ground node, a non-inverting input coupled to a reference voltage potential, and an output. A comparator has a first input coupled to the output of the transconductance amplifier, a second input coupled to a reference voltage potential, and an output coupled to the enable input of said charge pump.

8 Claims, 2 Drawing Sheets

DAC-BASED VOLTAGE REGULATOR FOR FLASH MEMORY ARRAY

PRIORITY CLAIM

This application claims priority to Italian Application Serial Number 2002A000941, filed Sep. 11, 2002.

BACKGROUND OF THE INVENTION

1. Field of the Invention

The present invention relates to charge pump circuits. More particularly, the present invention relates to a digital-to-analog-converter (DAC) based voltage regulator system that can regulate the output of charge pump circuits in a non-volatile memory for supplying various voltages utilized in the memory circuit.

2. The State of the Art

Non-volatile memories require a broad range of voltages that are applied to the word lines coupled to the gates of the memory cell transistors. A plurality of voltage regulators provide the different appropriate voltages for each operation of the device. The output voltage of each voltage regulator is fixed and the re is no way to change the output voltages of the regulator devices.

A non-volatile memory requires at least a voltage regulator for supplying a voltage to the memory cell gates for verifying a programmed cell and an erased cell, and a voltage regulator for supplying a programming voltage to the memory cell gates for programming memory cells. In some non-volatile memory devices the reliability of the cell requires that the program voltage not be constant but rather that the voltage is ramped. Additional analog circuits need to be provided for this purpose.

BRIEF DESCRIPTION OF THE INVENTION

The present invention provides a DAC-based voltage regulator for supplying the necessary regulated voltages to a non-volatile memory device. The voltage regulation is based on a current comparison between a reference current and a current signal obtained from the high-voltage output of the charge pump circuit. The N bits provided to the DAC generate $2^N$ current-reference levels that are sunk from a virtual ground. A voltage to current converter generates a current signal from the high-voltage output of the charge pump that is supplied to virtual ground. The current-error signal that comes from the comparison in the virtual ground is amplified and voltage converted by a transconductance amplifier. A second amplifier receives the output signal from the transconductance amplifier and outputs a CMOS-compatible voltage level that enables or discharges the charge pump in order to obtain the selected output voltage value. Thus, the charge pump can be regulated to one of $2^N$ values according to the input presented to the DAC.

The voltage regulator of the present invention is capable of supplying a wide range of output voltages to bias the word lines in a non-volatile memory device. N input signals are provided in order to select the appropriate output voltage for each operation of the non-volatile memory. Because of this feature, a voltage ramp can easily be generated by providing the sequence of the values of the ramp.

BRIEF DESCRIPTION OF THE DRAWING FIGURES

DETAILED DESCRIPTION OF THE INVENTION

Persons of ordinary skill in the art will realize that the following description of the present invention is only illustrative and not in any way limiting. Other embodiments of this invention will be readily apparent to those skilled in the art having benefit of this disclosure.

The voltage regulation is based on a current comparison between a reference current and a current signal obtained from the high-voltage output of the charge pump circuit. The N bits provided to the DAC generate $2^N$ current-reference levels that are sunk from a virtual ground. A voltage to current converter generates a current signal from the high-voltage output of the charge pump that is supplied to virtual ground. The current-error signal that comes from the comparison in the virtual ground is amplified and voltage converted by a transconductance amplifier. A second amplifier receives the output signal from the transconductance amplifier and outputs a CMOS-compatible voltage level that enables or discharges the charge pump in order to obtain the selected output voltage value. Thus, the charge pump can be regulated to one of $2^N$ values according to the input presented to the DAC.

Figure 1:
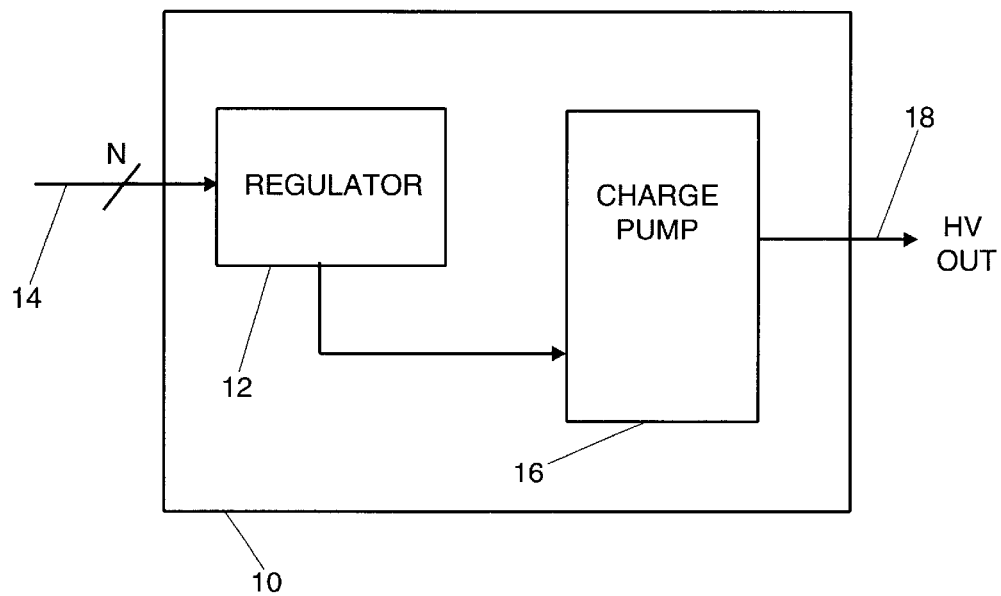
FIG. 1 is a block diagram of a charge-pump system 10 including the DAC-based voltage regulator of the present invention.

Referring first to FIG. 1, a block diagram of a charge-pump system 10 including the DAC-based voltage regulator of the present invention is presented. DAC-based voltage regulator 12 accepts an N-bit digital input on bus 14. DAC-based voltage regulator 12 supplies an enable signal to the charge pump 16 that either enables or discharges the charge pump 16 to regulate its high-voltage output at output node 18.

Figure 2:
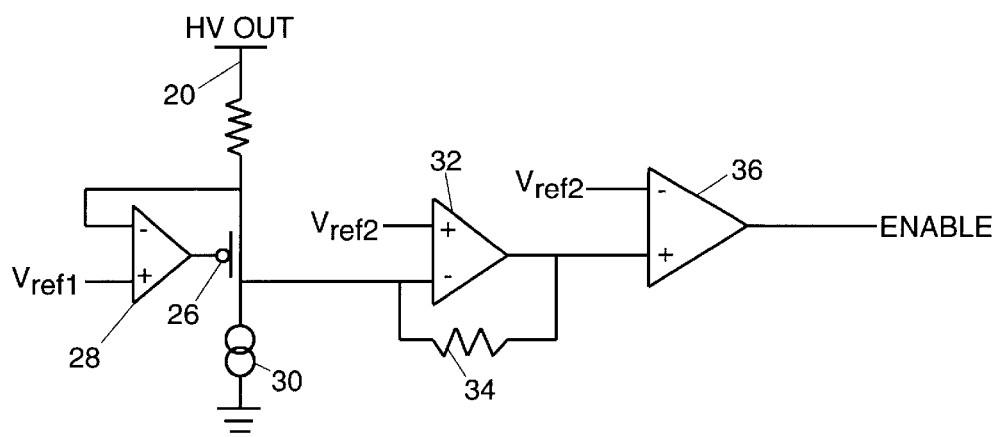
FIG. 2 is a schematic diagram of an illustrative DAC-based voltage regulator according to the present invention.

Referring now to FIG. 2, a simplified schematic diagram of the DAC-based regulator of the present invention is shown. The high-voltage output node of the charge pump (shown at reference numeral 20) is coupled to a virtual ground node 22 through resistor 24 and p-channel MOS transistor 26. P-channel MOS transistor 26 is driven from the output of amplifier 28. Amplifier 28 has its inverting input coupled to the connection between resistor 24 and the source of p-channel MOS transistor 26 and its non-inverting input coupled to a reference voltage $V_{ref1}$. Current source 30 can source $2^N$ levels of reference currents depending on the state of its N-input lines and is coupled to a circuit node comprising the drain of p-channel MOS transistor 26 and the inverting input of transconductance amplifier 32. Persons of ordinary skill in the art will appreciate that this circuit node is at virtual ground. The non-inverting input of transconductance amplifier 32 is coupled to a reference voltage $V_{ref2}$. Resistor 34 sets the gain of transconductance amplifier 32. Transconductance amplifier 32 drives the non-inverting input of transconductance amplifier 36. The inverting input of transconductance amplifier 36 is coupled to the reference voltage $V_{ref2}$.

Resistor 24, amplifier 28 and p-channel MOS transistor 26 generate a current signal that is a function of the voltage at the high-voltage output node 20 of the charge pump. This current signal is compared with the reference current signal from the current source 30. As will be disclosed more fully herein, the reference current may be set to one of $2^N$ levels.

The current error signal resulting from the comparison in the virtual ground is amplified and converted to a voltage in transconductance amplifier 32. The second amplifier 36 generates CMOS-compatible output levels to enable or discharge the charge pump.

Figure 3:
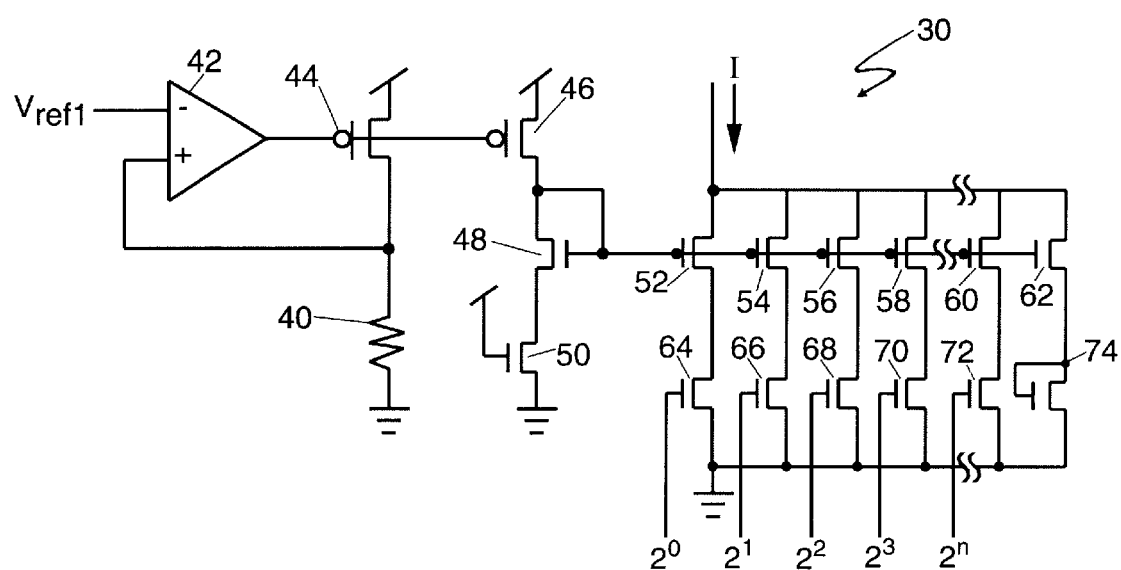
FIG. 3 is a detailed schematic diagram of an illustrative embodiment of circuit usable as the current source of FIG. 2.

Referring now to FIG. 3, current source 30 from FIG. 2 is shown in detail. The reference current is obtained from the resistor 40 biased from a constant-voltage drop $V_{ref1}$ controlled from amplifier 42 and p-channel MOS transistor 44. P-channel MOS transistor 46 and N-channel MOS transistors 48 and 50 mirror the current through p-channel MOS transistor 44. N-channel MOS transistors 52, 54, 56, 58, 60, and 62 are sized to multiply the current by powers of 2; transistor 52 is sized 1×; transistor 54 is sized 2×; transistor 56 is sized 4×; transistor 58 is sized 8×; transistor 60 is sized $(2^N)×$. Transistor 62 is minimum sized to bias the current source to a minimum current value. The current paths through transistors 52, 54, 56, 58, 60, and 62 are switched, respectively, by transistors 64, 66, 68, 70, 72, and 74. Transistors 64, 66, 68, 70, and 72 have their gates driven by a respective one of the N input control lines. Transistor 74 is diode connected to source minimum current when all of the N input lines are at logic zero.

The generation of the current signal from the high-voltage output node 20 (FIG. 2) of charge pump 30 is made by the amplifier 28 biasing its feedback loop at $V_{ref1}$. The value of the high-voltage output may be expressed as:

$$HVOUT=(n+1)(R24/R40)*V_{ref1}+V_{ref1}$$

As will be appreciated by persons of ordinary skill in the art, the regulation is a function of the ratio of the resistors and not the absolute value.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated voltage regulator system comprising:
   a charge pump circuit having an enable input and an voltage output node;
   N digital inputs;
   a control circuit coupled to said enable input of said charge pump, said control circuit including a digital-to-analog converter coupled to said N digital inputs and configured to drive said enable input of said charge pump to develop a voltage at said voltage output node of said charge pump circuit that is a monotonic function of a digital word applied to said N digital inputs.

2. The integrated voltage regulator system of claim 1 in combination with a non-volatile memory circuit.

3. An integrated voltage regulator system comprising:
   a charge pump circuit having an enable input and an voltage output node;
   a regulator circuit having N digital inputs for generating a regulator-output voltage of any one of $2^N$ values; and
   a comparator having inputs coupled to compare a voltage at said voltage output node of said charge pump with said regulator-output voltage and having an output coupled to said enable input of said charge pump circuit.

4. The integrated voltage regulator system of claim 3 in combination with a non-volatile memory circuit.

5. A DAC-based integrated voltage regulator system comprising:
   a charge pump circuit having an enable input and an voltage output node;
   a virtual ground node;
   N digital inputs;
   a voltage-to-current converter having an input coupled to said voltage output node and an output coupled to said virtual ground node;
   a current source coupled to said virtual ground node, said current source sinking one of a plurality of currents in response to states signal on said N digital inputs;
   a transconductance amplifier having an inverting input at said virtual ground node, a non-inverting input coupled to a reference voltage potential, and an output; and
   a comparator having a first input coupled to said output of said transconductance amplifier, a second input coupled to a reference voltage potential, and an output coupled to said enable input of said charge pump.

6. The integrated voltage regulator system of claim 5 in combination with a non-volatile memory circuit.

7. The DAC-based voltage regulator system of claim 5 wherein said current source comprises:
   a reference-voltage source;
   an amplifier having an inverting input coupled to said reference-voltage source, a non-inverting input, and an output;
   a first p-channel MOS transistor having a source coupled to a supply potential, a drain coupled to said non-inverting input of said amplifier, and a gate coupled to said output of said amplifier;
   a second p-channel MOS transistor having a source coupled to said supply potential, a drain, and a gate coupled to said output of said amplifier;
   a first n-channel MOS transistor having a drain and a gate coupled to the drain of said second p-channel MOS transistor, and a source;
   a second n-channel MOS transistor having a drain coupled to said source of said first n-channel MOS transistor, a gate coupled to said supply potential, and a source coupled to ground;
   a current-sink node;
   a bias circuit coupled between said current-sink node and ground potential, said bias circuit including a minimum-sized n-channel MOS bias transistor having a drain coupled to said current sink node, a gate coupled to the gate of said first n-channel MOS transistor and a source coupled to ground potential through a diode-connected n-channel MOS transistor; and
   N digital input stages, each digital input stage coupled between said current-sink node and ground potential and including a first input-stage n-channel MOS transistor having a drain coupled to said current sink node, a gate coupled to the gate of said first n-channel MOS transistor and a source coupled to ground potential through a second input-stage n-channel MOS transistor, said second input-stage n-channel MOS transistor having a gate coupled to one of said N digital inputs.

8. The DAC-based voltage regulator system of claim 5 wherein said regulator comprises:
   a current source;
   a transconductance amplifier having an inverting input coupled to said voltage output node of said charge pump circuit, a non-inverting input coupled to a first reference voltage, and an output;
   a p-channel MOS transistor having a source coupled to said inverting input of said transconductance amplifier, a drain coupled to said current source, and a gate coupled to said output of said transconductance amplifier;

a comparator having a non-inverting input coupled to a second reference voltage, an inverting input coupled to said drain of said p-channel MOS transistor, and an output coupled to said enable input of said charge pump circuit.

* * * * *

UNITED STATES PATENT AND TRADEMARK OFFICE
CERTIFICATE OF CORRECTION

PATENT NO. : 6,771,200 B2
DATED : August 3, 2004
INVENTOR(S) : Frulio et al.

It is certified that error appears in the above-identified patent and that said Letters Patent is hereby corrected as shown below:

<u>Title page,</u>
Item [75], Inventors, "Simone Bartozi" should read -- Simone Bartoli --.

Signed and Sealed this

Nineteenth Day of October, 2004

JON W. DUDAS
*Director of the United States Patent and Trademark Office*

UNITED STATES PATENT AND TRADEMARK OFFICE
CERTIFICATE OF CORRECTION

PATENT NO. : 6,771,200 B2  Page 1 of 1
APPLICATION NO. : 10/407647
DATED : August 3, 2004
INVENTOR(S) : Frulio et al.

It is certified that error appears in the above-identified patent and that said Letters Patent is hereby corrected as shown below:

Title page,
Add: [30] Foreign Application Priority Data
      Italian Application Serial No. 2002A000941, filed September 11, 2002.

Signed and Sealed this

Twenty-second Day of August, 2006

JON W. DUDAS
*Director of the United States Patent and Trademark Office*